United States Patent
Landru et al.

(10) Patent No.: US 11,424,156 B2
(45) Date of Patent: Aug. 23, 2022

(54) REMOVABLE STRUCTURE AND REMOVAL METHOD USING THE STRUCTURE

(71) Applicant: Soitec, Bernin (FR)

(72) Inventors: Didier Landru, Le Champ-près-Froges (FR); Oleg Kononchuk, Theys (FR); Nadia Ben Mohamed, Echirolles (FR); Rénald Guerin, Saint Ismier (FR); Norbert Colombet, Domene (FR)

(73) Assignee: Soitec, Benin (FR)

( * ) Notice: Subject to any disclaimer, the term of this patent is extended or adjusted under 35 U.S.C. 154(b) by 0 days.

(21) Appl. No.: 16/969,346

(22) PCT Filed: Jan. 14, 2019

(86) PCT No.: PCT/FR2019/050065
§ 371 (c)(1),
(2) Date: Aug. 12, 2020

(87) PCT Pub. No.: WO2019/158833
PCT Pub. Date: Aug. 22, 2019

(65) Prior Publication Data
US 2021/0050249 A1     Feb. 18, 2021

(30) Foreign Application Priority Data
Feb. 13, 2018   (FR) ........................... 1851179

(51) Int. Cl.
*H01L 21/762*    (2006.01)
*H01L 21/20*     (2006.01)

(52) U.S. Cl.
CPC .... *H01L 21/76254* (2013.01); *H01L 21/2007* (2013.01); *H01L 21/76243* (2013.01); *H01L 21/76259* (2013.01)

(58) Field of Classification Search
CPC ........... H01L 21/76254; H01L 21/2007; H01L 21/76259; H01L 21/76243
See application file for complete search history.

(56) References Cited

U.S. PATENT DOCUMENTS 6,211,041 B1 * 4/2001 Ogura ................. H01L 21/7624
257/347
8,404,563 B2    3/2013 Hanaoka
(Continued)

FOREIGN PATENT DOCUMENTS

FR    2756847 A1    6/1998
FR    2865574 A1 *  7/2005 ....... H01L 21/76254
(Continued)

OTHER PUBLICATIONS

International Search Report for International Application No. PCT/FR2019/050065, dated Mar. 6, 2019, 4 pages.
(Continued)

*Primary Examiner* — Dale E Page
*Assistant Examiner* — Quovaunda Jefferson
(74) *Attorney, Agent, or Firm* — TraskBritt

(57) ABSTRACT

A detachable structure comprises a carrier substrate and a silicon oxide layer positioned on the substrate at a first interface. The detachable structure is notable in that: the oxide layer has a thickness of less than 200 nm; light hydrogen and/or helium species are distributed deeply and over the entire area of the structure according to an implantation profile, a maximum concentration of which is located in the thickness of the oxide layer; the total dose of implanted light species, relative to the thickness of the oxide layer, exceeds, at least by a factor of five, the solubility limit of these light species in the oxide layer.

20 Claims, 6 Drawing Sheets

(56) References Cited

U.S. PATENT DOCUMENTS

| | | | |
|---|---|---|---|
| 9,673,086 B2 | 6/2017 | Yokokawa et al. | |
| 2002/0022337 A1* | 2/2002 | Maleville | H01L 21/6835 438/406 |
| 2004/0079941 A1* | 4/2004 | Yamazaki | H01L 27/3244 257/40 |
| 2011/0012200 A1* | 1/2011 | Allibert | H01L 29/32 257/347 |

FOREIGN PATENT DOCUMENTS

| | | | |
|---|---|---|---|
| TW | 201118941 A | 6/2011 | |
| TW | 201515069 A | 4/2015 | |
| TW | 201523743 A | 6/2015 | |
| TW | 201606878 A | 2/2016 | |

OTHER PUBLICATIONS

International Written Opinion for International Application No. PCT/FR2019/050065, dated Mar. 6, 2019, 5 pages.

Singaporean Written Opinion for Singaporean Application No. 11202005260Q dated Sep. 20, 2021, 5 pages with English translation.

Taiwanese Office Action for Application No. 11120079810 dated Jan. 22, 2022, 2 pages.

* cited by examiner

REMOVABLE STRUCTURE AND REMOVAL METHOD USING THE STRUCTURE

CROSS-REFERENCE TO RELATED APPLICATIONS

This application is a national phase entry under 35 U.S.C. § 371 of International Patent Application PCT/FR2019/050065, filed Jan. 14, 2019, designating the United States of America and published as International Patent Publication WO 2019/158833 A1 on Aug. 22, 2019, which claims the benefit under Article 8 of the Patent Cooperation Treaty to French Patent Application Serial No. 1851179, filed Feb. 13, 2018.

TECHNICAL FIELD

The present disclosure relates to the field of transferring thin layers for applications in microelectronics, optics, microsystems, etc. It relates, in particular, to a detachable structure that may be used to transfer or to handle thin layers.

BACKGROUND

Silicon or silicon-on-insulator (SOI) substrates are widely used for the fabrication of microelectronic devices. As is well known per se, such a substrate comprises a thin layer of silicon and a buried oxide, positioned on a carrier substrate. To enable an even greater integration of transistors on these substrates, the reduction in the lateral dimensions of the individual components and the fineness of etching require substrates of increasing quality, both in terms of crystalline quality and uniformity of layers.

For the production of an SOI substrate having the required quality, high-temperature heat treatments are applied, in particular, to achieve the finishing of the thin layer of silicon. In particular, a step of thermal annealing at around 1200° C., under an inert atmosphere may be used for the thermal smoothing of the thin layer in order to achieve the required degree of surface roughness, typically <0.2 nm RMS, while retaining a very good thickness uniformity of the thin layer.

Certain applications require not only a high quality of the thin layer in which the components will be produced, but also a carrier substrate that has particular characteristics. This is, for example, the case in the field of radiofrequency (RF) components, for which it is advantageous to have a highly resistive carrier substrate. A glass substrate may, for example, be advantageous. Alternatively, when the carrier substrate is made of high-resistivity silicon, it is advantageously provided with a charge-trapping layer, so as to limit the losses and distortions of the RF signal. Reference may be made, on this subject, to the book "Silicon-on-insulator (SOI) Technology, manufacture and applications" (points 10.7 and 10.8, Oleg Kononchuk and Bich-Yen Nguyen, Woodhead Publishing), which relates, in particular, to SOI substrates with a trapping (trap-rich) layer.

When the carrier substrate is made of a material other than silicon (for example, glass) or when it is provided with a trapping layer, the heat treatments at very high temperature for finishing the SOI substrate cannot be applied since they would deteriorate the structure or the trapping layer.

However, without these treatments, it is difficult to guarantee the required quality of the thin layer.

Several processes exist for transferring, to a final substrate, a thin layer produced on an initial substrate and having, before the transfer, the required final quality. The initial substrate customarily comprises a buried oxide layer on which the thin layer is positioned, the oxide layer itself being positioned on a carrier substrate, suitable for undergoing the treatments for finishing the thin layer. Furthermore, the final substrate has the required characteristics for a targeted specific application.

Some transfer processes consist in attaching the finished thin layer (positioned on the initial substrate) to the final substrate, then in mechanically and/or chemically removing the carrier substrate from the initial substrate, thus transferring the thin layer to the final substrate. The main drawbacks of this approach are the costs related to the loss of the initial carrier substrate and the limiting mechanical and chemical treatments that are liable to negatively affect the quality of the thin layer during transfer.

Other processes are based on a separation by application of a mechanical stress or a chemical treatment to a layer or a weakened interface present in the initial substrate, between the thin layer and the carrier substrate of the initial substrate, making it possible to transfer the thin layer from the initial substrate to the final substrate.

The drawbacks of these approaches stem primarily from the fact that the separation steps, by application of a mechanical force to the initial substrate-final substrate assembly or by immersion in a chemical solution, are liable to negatively affect the quality of the thin layer.

Still other processes, based on separation at an interface by laser (laser lift-off), require the use of a transparent substrate (for the final substrate or for the initial carrier substrate), which limits the field of applications.

Finally, document FR2756847 proposes a process for separating two elements of a structure by ion implantation. This process consists in introducing ions at the interface of the two elements, these ions being capable of breaking the interatomic bonds that exist between the two elements.

One drawback of this process is that it requires a large dose and good accuracy regarding the implantation depth.

BRIEF SUMMARY

The present disclosure aims to overcome all or some of the drawbacks of the prior art. One subject of the present disclosure is a structure configured in order to be detachable at an interface, and which may be used for transferring or handling thin layers.

The present disclosure relates to a detachable structure comprising a carrier substrate and a silicon oxide layer positioned on the substrate at a first interface. The detachable structure is notable in that:
  the oxide layer has a thickness of less than 200 nm;
  light hydrogen and/or helium species are distributed deeply and over the entire area of the structure according to an implantation profile, the concentration maximum of which is located in the thickness of the oxide layer;
  the total dose of implanted light species, relative to the thickness of the oxide layer, exceeds, at least by a factor of five, the solubility limit of these light species in the oxide layer.

According to advantageous features of the present disclosure, taken alone or in combination:
  the detachable structure comprises a thin layer suitable for the fabrication of components and/or a thin layer forming a barrier layer, positioned on the oxide layer at a second interface;
  the carrier substrate is made of silicon and the silicon oxide layer is a thermal oxide;
  the thin layer is made of monocrystalline silicon;

the thin layer is made of silicon nitride.

The present disclosure also relates to a process for detaching the detachable structure as above, comprising:
- a) the attaching of the detachable structure to a second substrate along a bonding interface;
- b) the application of a heat treatment to the assembly to make at least some of the light species migrate level with the first interface or second interface;
- c) the spontaneous detachment of the assembly at the first interface or the second interface, forming a detached surface of the oxide layer and leading to the transfer of at least the thin layer to the second substrate in order to form a composite structure.

According to advantageous features of the present disclosure, taken alone or in combination:
- step b) is carried out at a temperature between 200° C. and 600° C.;
- step c) is carried out during the heat treatment of step b);
- the roughness of the detached surface of the oxide layer is less than 0.5 nm RMS;
- the detachable structure provided in step a) comprises a thin layer suitable for the fabrication of components and which is positioned on the oxide layer at the second interface, and the light hydrogen and/or helium species have been implanted in the thickness of the oxide layer after a step of finishing the thin layer;
- the step of finishing the thin layer comprises a high-temperature heat treatment, in particular, above 1000° C., or even above 1100° C.;
- the second substrate provided in step a) comprises a second carrier substrate, a trapping layer positioned on the second carrier substrate and a second silicon oxide layer positioned on the trapping layer, the second silicon oxide layer being intended to be attached to the detachable substrate at the bonding interface;
- the second substrate provided in step a) comprises a glass substrate;
- the second substrate provided in step a) comprises a second carrier substrate and a second silicon oxide layer positioned on the second carrier substrate and having a thickness of greater than 800 nm, the second silicon oxide layer being intended to be attached to the detachable substrate at the bonding interface;
- the detachment process comprises, after step c), a step of heat treatment of the composite structure at a temperature below 1000° C., in order to discharge the light species still present in the transferred thin layer.

BRIEF DESCRIPTION OF THE DRAWINGS

Other features and advantages of the present disclosure will become apparent from the following detailed description, which is provided with reference to the appended figures, wherein.

DETAILED DESCRIPTION

In the description, the same references in the figures might be used for elements of the same nature.

The figures are schematic representations which, for the sake of legibility, are not to scale. In particular, the thicknesses of the layers along the z-axis are not to scale with respect to the lateral dimensions along the x- and y-axes.

Figure 1:
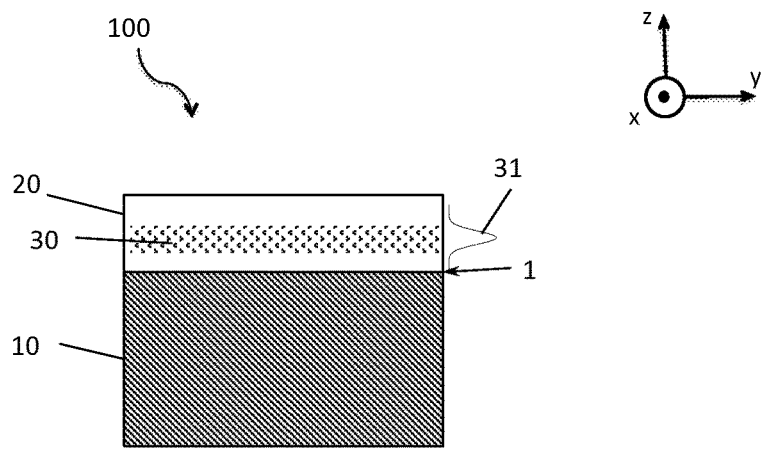
FIG. 1 shows a detachable structure according to a first embodiment of the present disclosure.

The present disclosure relates to a detachable structure 100 comprising a carrier substrate 10 and a silicon oxide layer 20 positioned on the substrate at a first interface 1 (FIG. 1).

The carrier substrate 10 may be chosen from materials compatible with microelectronic fabrication processes; advantageously, it is formed of silicon, a material conventionally used in the semiconductor industry. The carrier substrate 10 may be in the form of a wafer having a diameter from 100 to 450 mm and a thickness between 250 and 850 microns, for example.

The silicon oxide layer 20 is advantageously derived from thermal growth, when the carrier substrate 10 is chosen to be silicon. The thermal oxidation may be carried out at a temperature between 850° C. and 1100° C., under a dry or wet oxidizing atmosphere. Alternatively, it may be produced on the carrier substrate 10 by a vapor deposition (PECVD, LPCVD, etc.) or liquid deposition technique.

In the detachable structure 100 according to the present disclosure, the oxide layer 20 has a thickness of less than 200 nm, or even of less than 100 nm; advantageously the thickness of the oxide layer 20 is between 10 nm and 50 nm.

It will subsequently be seen how this restriction on the thickness of the oxide layer 20 provides a good detachment efficiency of the structure 100.

The detachable structure 100 further comprises light hydrogen and/or helium species 30, distributed deeply, according to an implantation profile 31, in the oxide layer 20: the implantation profile 31 is illustrated in FIG. 1, it extends along the z-axis. The light species 30 are present over the entire area of the structure 100 in the (x,y) plane.

They are advantageously introduced into the oxide layer 20 by ion implantation. Alternatively, and, in particular, when the light species must be introduced at a shallow depth, they could be implanted by plasma immersion.

In the detachable structure 100 according to the present disclosure, it will be possible to implant hydrogen alone, helium alone or else to co-implant hydrogen and helium.

The concentration maximum of the implantation profile 31 is located in the thickness of the oxide layer 20, advantageously close to the median portion of the thickness.

After implantation, the total dose implanted is found, preferentially, for the most part within the oxide layer 20.

According to the present disclosure, the total dose of implanted light species 30, relative to the thickness of the oxide layer 20, exceeds, at least by a factor of five, the solubility limit of these light species 30 in the oxide layer 20. Advantageously, the total dose of implanted light species 30, relative to the thickness of the oxide layer 20, exceeds the solubility limit by a factor of five to twenty. Bear in mind that the solubility limit of hydrogen in a silicon oxide is $1.5^{E}21/cm^3$.

According to a first embodiment, the detachable structure 100 therefore comprises the carrier substrate 10, the silicon oxide layer 20 and the light species 30 distributed according to an implantation profile 31 in the oxide layer 20.

By way of example, for an oxide layer 20 having a thickness of 50 nm, hydrogen ions having an energy of 1 keV could be implanted at a dose of the order of $4^E16/\text{cm}^2$. The total implanted dose ($4^E16/\text{cm}^2$), relative to the thickness of the oxide layer 20 gives a hydrogen concentration of $8^e21/\text{cm}^3$, i.e., slightly more than five times the solubility limit of hydrogen in the silicon oxide layer 20.

Typically, for an oxide layer 20 having a thickness ranging from several nm to 100 nm, an implantation energy ranging from several hundreds of eV to around 10 keV and a dose ranging from around $1^E16$ to $7.5^E16/\text{cm}^2$ could be used for the implantation of hydrogen. Advantageously, for an oxide layer 20 having a thickness between 10 nm and 50 nm, a hydrogen implantation dose will be chosen between $1^E16$ and $4^E16/\text{cm}^2$.

The detachable structure 100 thus has the ability to be detachable at the first interface 1, when it is subjected to a heat treatment, the temperature of which is typically between 200° C. and 600° C.

After heat treatment, the total dose of light species 30 implanted will be found for the most part within the oxide layer 20 (either owing to the direct implantation into the oxide layer 20, or owing to the migration of the species 30 into the oxide layer 20). The concentration of light species 30 then exceeds the solubility limit of this same species in the oxide layer 20, by a factor of five to twenty.

The oxide layer 20 being thin and the concentration of the light species 30 being well beyond the solubility limit of the species 30 in the oxide layer 20, the light species will not be able to be absorbed by the oxide layer 20 and some of the light species will effectively migrate to the first interface 1.

This first interface 1 advantageously being a thermal interface (i.e., derived from the growth of a thermal oxide layer on the silicon carrier substrate), it has been shown experimentally that the light species 30 preferentially migrate to this interface, and that, above a certain concentration, a cleavage of the interface occurs spontaneously under the effect of the pressure of the light species 30. As will be seen in greater detail in the detachment process, the detachable structure 100 may thus give rise to a detachment between the oxide layer 20 and the carrier substrate 10, along the first interface 1.

Figure 2A:
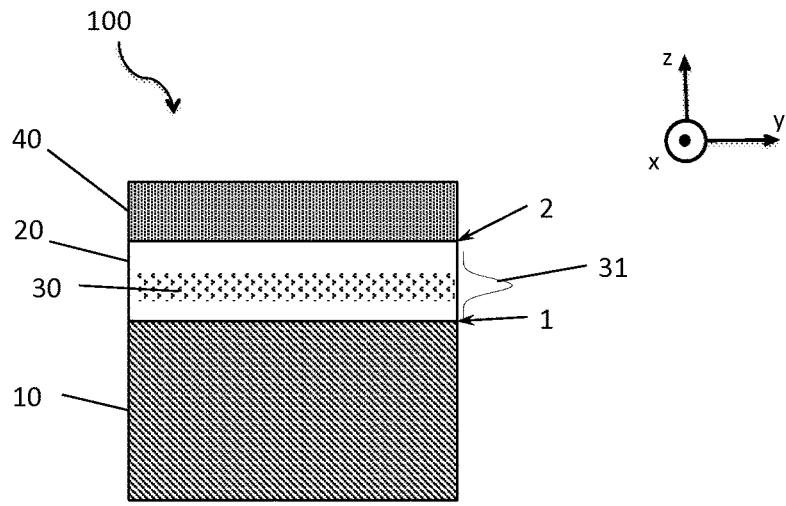
FIGS. 2a and 2b show detachable structures, respectively, according to a second and a third embodiment of the present disclosure.

According to a second embodiment, the detachable structure 100 further comprises a thin layer 40 suitable for the fabrication of components, positioned on the oxide layer 20 at a second interface 2 (FIG. 2a).

In this second embodiment, the light species 30 are introduced into the oxide layer 20 after the production of the thin layer 40 suitable for the fabrication of components.

The expression "suitable for the fabrication of components" is understood to mean having the quality and the structural characteristics required for the subsequent fabrication of the targeted components. In particular, the thin layer 40 has the required quality in terms of thickness uniformity, crystalline quality and surface quality (roughness, defectivity and residual contaminations). This therefore assumes that the thin layer 40, positioned on the oxide layer 20, itself positioned on the carrier substrate 10 has been able to undergo high-temperature finishing heat treatments. In particular, a step of thermal annealing at around 1200° C., under an inert atmosphere may be used for the thermal smoothing of the thin layer 40 in order to achieve the required degree of surface roughness, typically <0.2 nm RMS, while retaining a very good thickness uniformity of the thin layer. It is noted that during these treatments, the light species 30 are not yet present in the detachable structure 100, in order to avoid any untimely detachment.

Figure 3A:
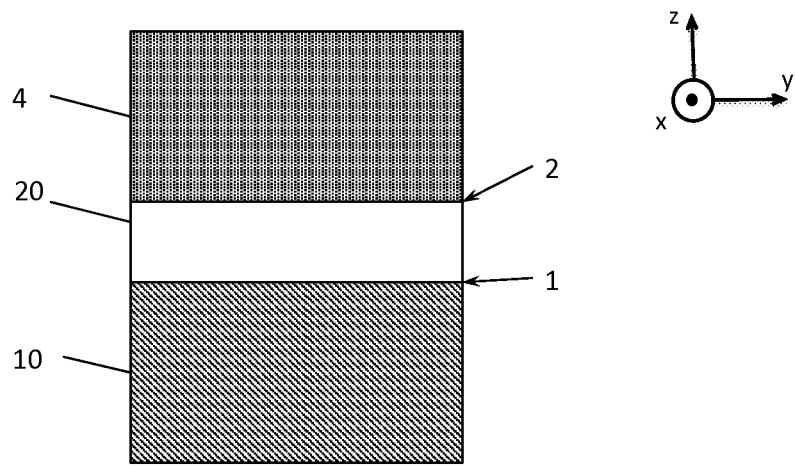
FIGS. 3a, 3b and 3c show a process for fabricating a detachable structure according to the second embodiment of the present disclosure.

The thin layer 40 may be produced in various ways. In general, the thin layer 40 is derived from a donor substrate 4 (FIG. 3a), attached to the oxide layer 20 at the second interface 2. Note that, alternatively, the oxide layer 20 may be present on the donor substrate 4 (at the second interface 2) and attached to the carrier substrate 10 (at the first interface 1).

The attaching operation may be performed by any bonding technique that is compatible with the high-temperature treatments intended for the finishing of the thin layer 40. In particular, the attaching operation is carried out by bonding by molecular adhesion, a technique well known from the prior art. Prior to the bonding operation, the surfaces to be attached may undergo dry (plasma activation, for example) and/or wet (chemical cleaning) treatments in order to improve the quality and the strength of the interface. The second interface 2 is advantageously enhanced by applying a heat treatment.

Figure 3B:
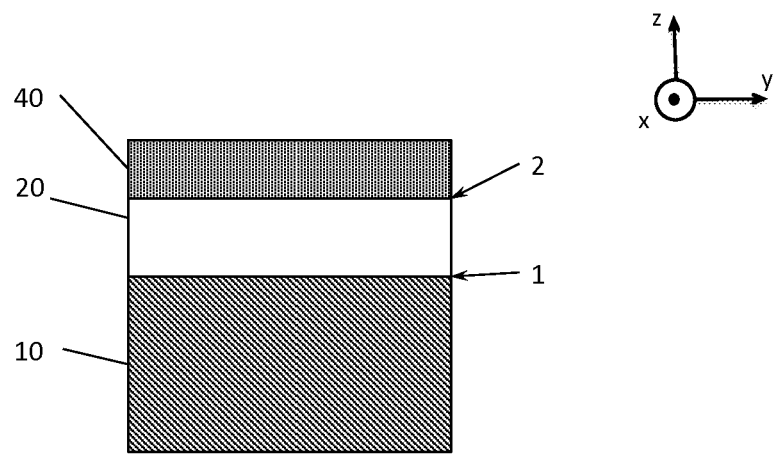

The donor substrate 4 next undergoes a thinning step, upon completion of which the surface layer 40 will be formed (FIG. 3b). This thinning step may be carried out using various techniques known from the prior art, in particular:

- the SMART-CUT® process, which is particularly suitable for the formation of very thin layers (typically between several nanometers and 1 micron in thickness): it is based on implanting gaseous species into the donor substrate 4 at the site of its attached face, prior to the attaching step, in order to form a weakened buried plane; after attachment, in a cleaving step, the donor substrate 4 is separated along the weakened plane so that only the thin layer 40 remains connected to the carrier substrate 10.
- chemical-mechanical thinning processes, including mechanical grinding, chemical-mechanical polishing and chemical etching, which are primarily suited to the formation of layers whose thicknesses are between a few microns and a few tens, or even hundreds, of microns.

Of course, the techniques mentioned above are not exhaustive and other known techniques may be used to thin the donor substrate 4.

With a view to fabricating the thin layer 40, the thinning step further comprises one or more finishing steps, capable of restoring the quality, in terms of surface and volume, of the thin layer 40, as mentioned above.

The requirements in terms of finishing are even greater when the thin layer 40 has a thin thickness, in particular, less than 200 nm, or less than 100 nm, or else less than 50 nm. It is, in particular, for the thin layers 40 in these thickness ranges that the detachable substrate 100 according to the present disclosure has the greatest interest.

Figure 3C:
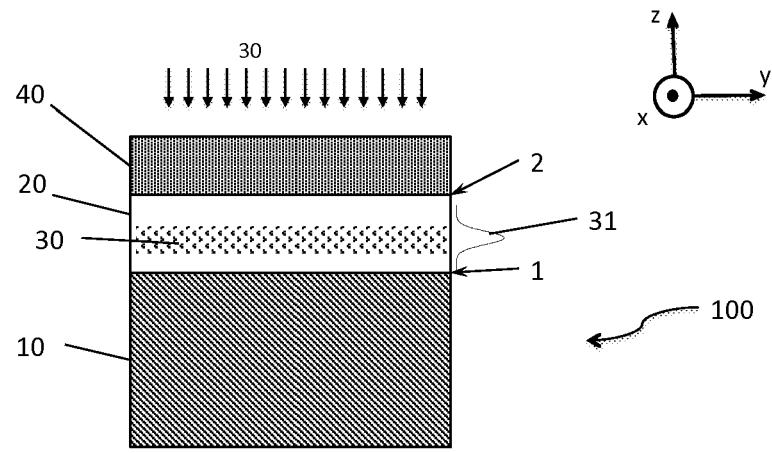

When the thin layer 40 is produced and has the characteristics required for the targeted application, the light species 30 are introduced according to the implantation profile 31 into the oxide layer 20 (FIG. 3c).

By way of example, in the case of a thin layer 40 made of silicon having a thickness of 200 nm and a silicon oxide layer 20 having a thickness of 25 nm, hydrogen ions having an energy of 18 keV could be implanted at a dose of $4^E16/\text{cm}^2$. The total implanted dose ($4^E16/\text{cm}^2$), relative to the thickness of the oxide layer 20 gives a hydrogen concentration of $1.6^E22/cm^3$, i.e., around ten times the solubility limit of hydrogen in the silicon oxide layer 20.

Typically, for a thin layer 40 made of silicon having a thickness ranging from several nm to 200 nm, and an oxide layer 20 having a thickness ranging from several nm to 100 nm, a dose ranging from around $1^E16$ to $7.5^E16/cm^2$ could be used for the implantation of hydrogen. Advantageously, for an oxide layer 20 having a thickness between 10 nm and 50 nm, the hydrogen implantation dose will be chosen between $1^E16$ and $4^E16/cm^2$.

The detachable structure 100 thus has the ability to be detachable at the first interface 1 or the second interface 2, when it is subjected to a heat treatment, as explained within the context of the first embodiment.

Note that, in the case of a thin layer 40 made of silicon having a thickness of 200 nm and a silicon oxide layer 20 having a thickness of 50 nm, it is shown that co-implantation of hydrogen and helium ions, by placing the maximum of the implantation profiles within the oxide layer 20, at respective doses of the order of $1^E16/cm^2$ and $1^E16/cm^2$, would also provide the structure 100 with the ability to be detachable at the first interface 1 or second interface 2, when it is subjected to a heat treatment. The total implanted dose of hydrogen ($1^E16/cm^2$), relative to the thickness of the oxide layer 20 gives a hydrogen concentration of $2^E21/cm^3$, i.e., only around 1.3 times the solubility limit of hydrogen in the silicon oxide layer 20; the presence of helium therefore makes it possible to reduce the required concentration factor of the hydrogen.

Advantageously, according to the second embodiment of the present disclosure, when one of the first 1 and second 2 interfaces is derived from a thermal growth of silicon oxide on the carrier substrate 10 (first interface 1) or on the donor substrate 4 (second interface 2), the detachment preferentially takes place at this interface. Specifically, it was observed that the thermal oxide/silicon interface became weaker than the bonding interface after the detachable structure 100 had been exposed to temperatures above 900° C. (which is the case after the finishing treatments of the thin layer 40). The migration and accumulation of the light species 30 therefore takes place preferentially at the one of the first 1 and second 2 interfaces, which is a thermal interface.

Figure 2B:
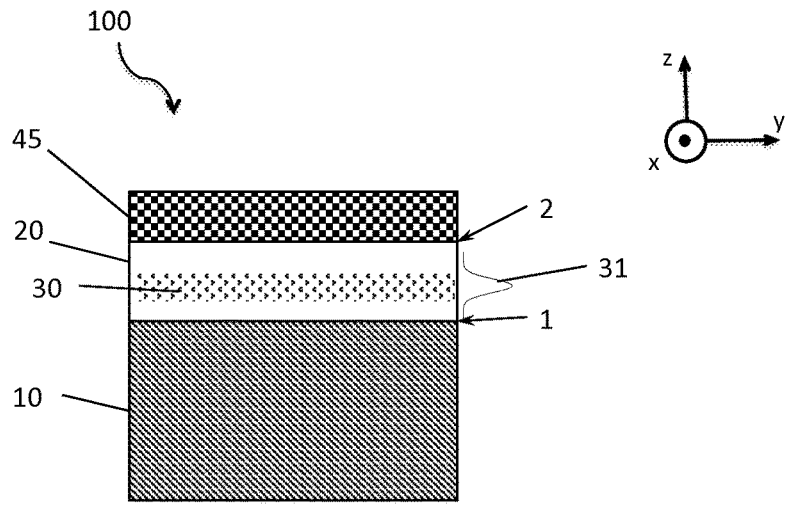

According to a third embodiment, the detachable structure 100 comprises the carrier substrate 10, the oxide layer 20, and the light species 30 distributed according to an implantation profile 31 in the oxide layer 20, and a thin barrier layer 45 forming a barrier layer, positioned on the oxide layer 20 at a second interface 2 (FIG. 2b).

The barrier layer 45 has the role of limiting, or even preventing the diffusion of the light species 30 and therefore of favoring the concentration thereof in the oxide layer 20, in particular, during the heat treatment targeting the detachment of the structure 100.

The thin barrier layer 45 could, for example, consist of silicon nitride, aluminum nitrite, alumina or other crystalline semiconductor (Si, Ge, SiC), directly deposited on the oxide layer 20.

In this third embodiment, the light species 30 are advantageously introduced into the oxide layer 20 after production of the barrier layer 45, in order to limit the application of a heat treatment to the detachable structure, before the detachment step and to avoid any untimely detachment.

By way of example, in the case of a thin layer 40 made of silicon nitride having a thickness of 30 nm and a silicon oxide layer 20 having a thickness of 30 nm, hydrogen ions having an energy of 2 keV could be implanted at a dose of the order of $3^E16/cm^2$. The total implanted dose ($3^E16/cm^2$), relative to the thickness of the oxide layer 20 gives a hydrogen concentration of $1^E22/cm^3$, i.e., around seven times the solubility limit of hydrogen in the silicon oxide layer 20.

The thin barrier layer 45 makes it possible to maintain the confinement and the saturation of the light species in the oxide layer 20: this favors the migration of the species 30 to the first 1 or second 2 interface.

The detachable structure 100 thus has the ability to be detachable at the first interface 1 or the second interface 2, when it is subjected to a heat treatment, as explained above.

The detachable structure 100 according to this third embodiment may be used as temporary support for the handling of partially or fully processed virgin layers.

The present disclosure also relates to a process for detaching the detachable structure 100.

This process makes provision for the use of a detachable structure 100 according to one or other of the embodiments described above.

Figure 4A:
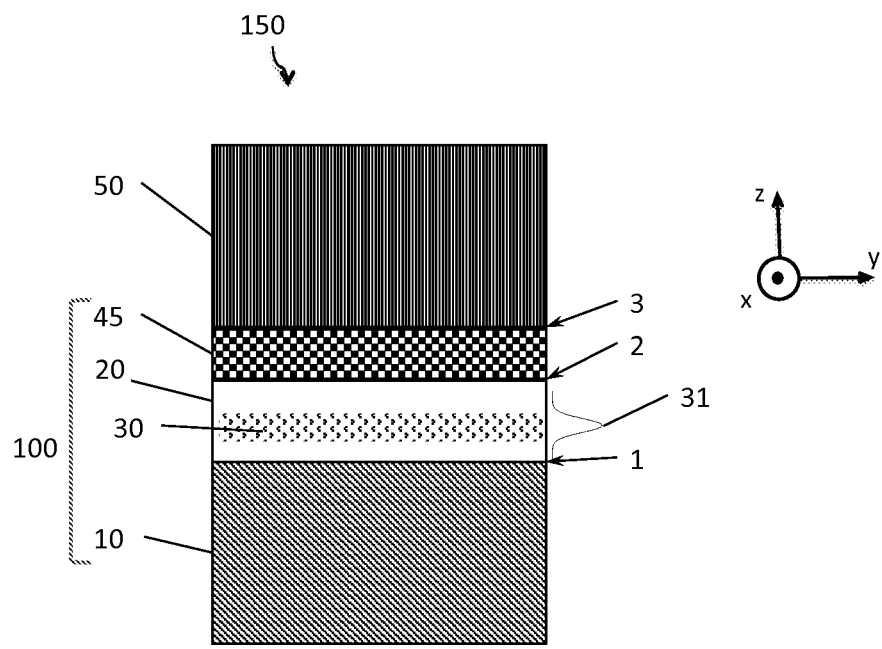
FIGS. 4a, 4a', 4b and 4c show a detachment process according to a first variant of implementation of a detachable structure in accordance with the present disclosure.
Figure 4A:
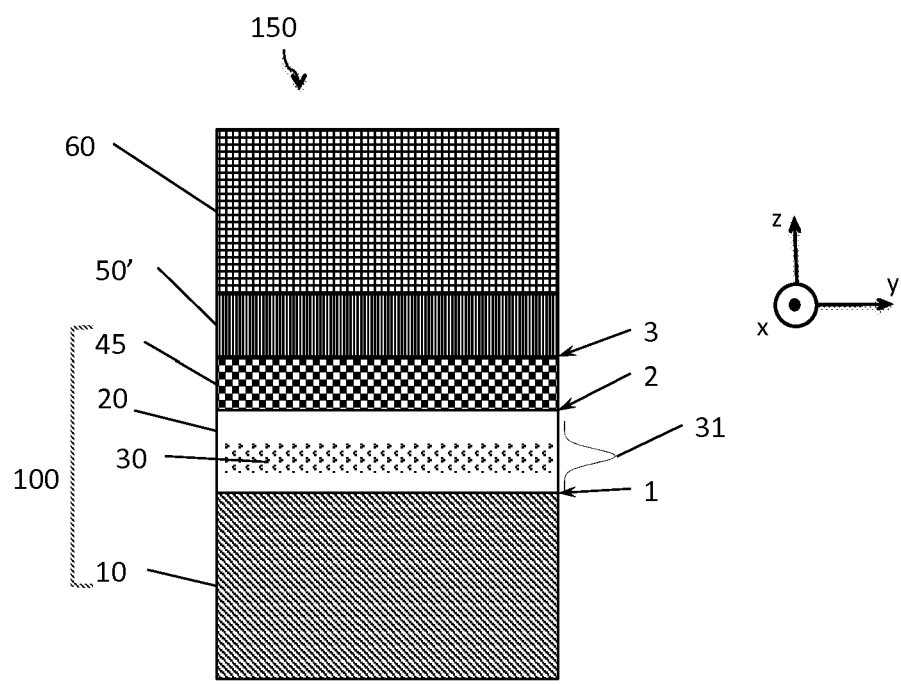
Figure 5A:
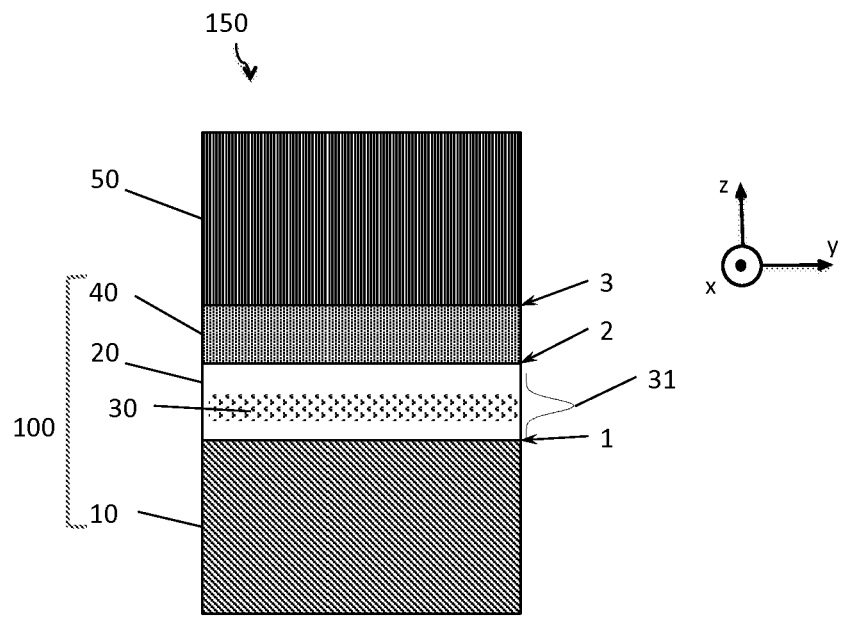
FIGS. 5a, 5b and 5c show a detachment process according to a second variant of implementation of a detachable structure in accordance with the present disclosure.
Figure 5B:
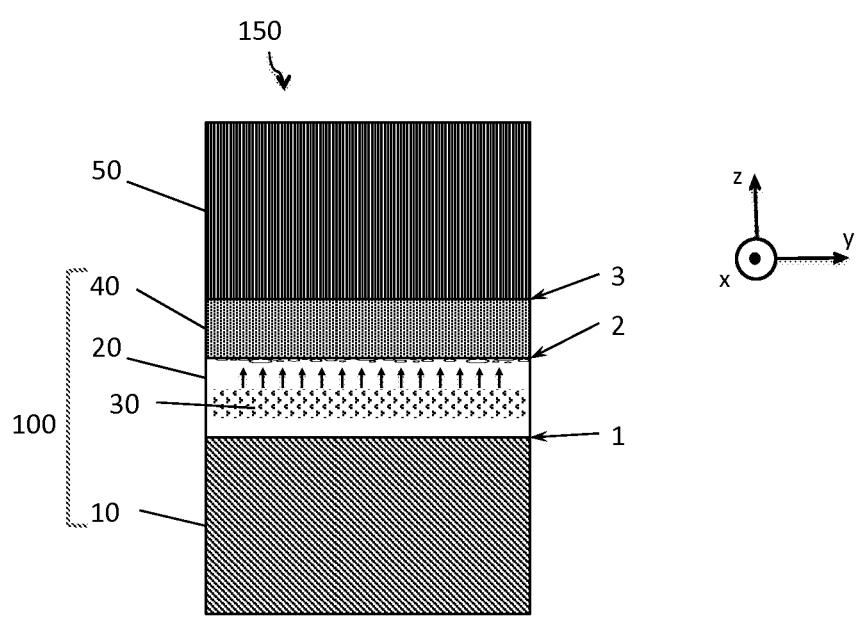

The detachment process firstly comprises a step a) of attaching the detachable structure 100 to a second substrate 50 along a bonding interface 3 (FIGS. 4a and 5a).

According to a first embodiment variant, the second substrate 50 is intended, on the one hand, to be thinned in order to form a useful layer 50' and, on the other hand, to be attached to a third substrate 60 (FIG. 4a'). The detachable structure 100 in this case fulfils the role of a temporary handle enabling the handling of the layer 50' during the steps of thinning the second substrate 50 and of attaching to the third substrate 60. A detachable structure 100 according to the first or third embodiment described above will be particularly suitable for such a temporary handle application.

According to a second embodiment variant (FIG. 5a), the second substrate 50 has specific characteristics and it is intended to receive the thin layer 40 suitable for the fabrication of components (i.e., which is finished and has the required quality), in order to subsequently undergo steps of component fabrication, for a specific application. The detachable structure 100 according to the second embodiment described above in this case enables the transfer of the thin layer 40 from the initial carrier substrate 10, compatible with the steps of finishing the thin layer 40, to a specific second substrate 50.

Figure 4B:
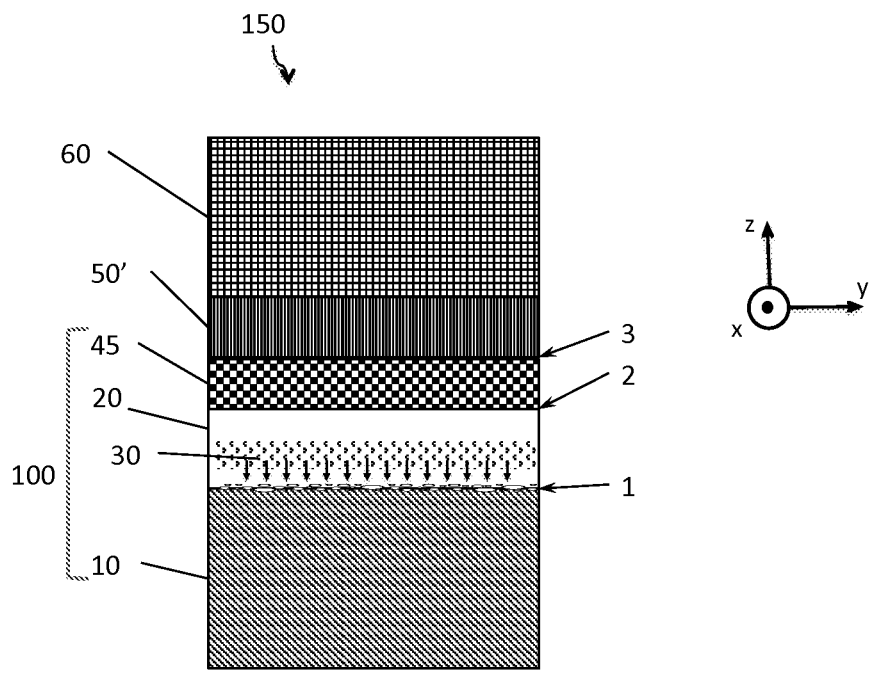

The detachment process according to the present disclosure then comprises a step b) during which a heat treatment is applied to the assembly 150 in order to make at least some of the light species 30 migrate level with one of the first 1 and second 2 interfaces (level with the first interface 1, illustrated by way of example in FIGS. 4b).

Advantageously, step b) is carried out at a temperature between 200° C. and 600° C.

Since the oxide layer 20 is thin and the concentration of the light species 30 exceeds the solubility limit of this same species in the oxide layer 20 to a very great extent (by a factor of five to twenty), the light species 30 will not be able to be absorbed completely by the oxide layer 20 and some of the light species 30 will effectively migrate to the first 1 and second 2 interfaces. If the first interface 1 (or alternatively the second interface 2) is a thermal interface, i.e., derived from the growth of a thermal oxide layer on the silicon carrier substrate 10 (or alternatively on the donor substrate 4), it will preferentially attract and trap light species 30. The increasing concentration of light species 30 at this interface will produce a cleavage of the interface under the effect of the pressure of the light species 30.

The detachment process according to the present disclosure finally comprises a step c) of spontaneous detachment of the assembly 150 at the first interface 1 (FIG. 4c), giving rise to a detached surface 21 of the oxide layer 20 transferred to a composite structure 200 and to a detached surface 11 of the carrier substrate 10. Alternatively, the detachment takes place at the second interface 2 (FIG. 5c), giving rise to a detached surface 21 of the oxide layer 20, which remains on the carrier substrate 10, and to a detached surface 41 of the thin layer 40.

The expression "spontaneous detachment" is understood to mean a detachment that does not require external mechanical or chemical stress. It is the cleavage of the first 1 or second 2 interface by the concentration of the light species 30 and the pressure of the gaseous species formed from the light species 30, which induces the detachment, over the entire area of the detachable structure 100.

This spontaneous detachment advantageously takes place during the heat treatment of step b).

Figure 4C:
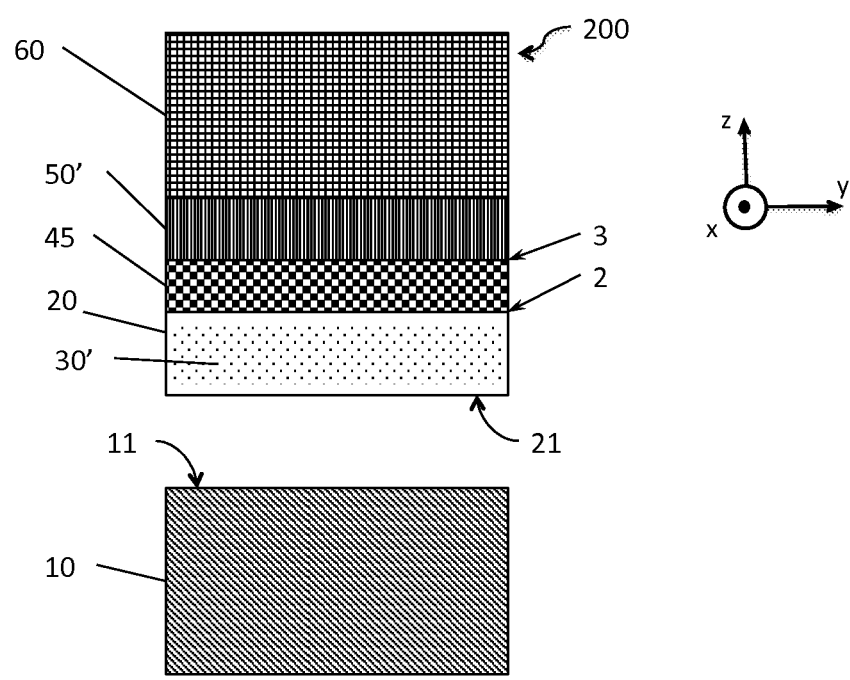
Figure 5C:
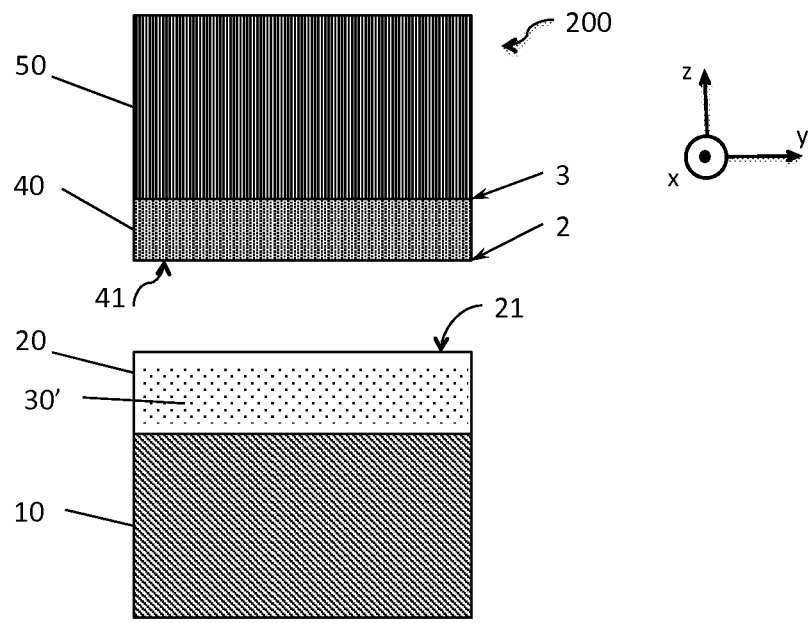

Obtained at the end of the detachment are, on the one hand, a composite structure 200 comprising the useful layer 50' or the thin layer 40, depending on the embodiments, and, on the other hand, the carrier substrate 10 of the detachable structure 100 (FIGS. 4c and 5c). The oxide layer 20, depending on whether the detachment interface is the first 1 or the second 2 interface, is found in the composite structure 200 or on the carrier substrate 10.

The detachment process according to the present disclosure makes it possible to obtain a roughness of the detached surface 21 of the oxide layer 20 of less than 0.5 nm. This feature is favored by the fact that no damaging of the first interface 1 (or of the second interface 2) occurs during the introduction of the light species 30, since the concentration maximum of the implantation profile always remains, according to the present disclosure, located within the oxide layer 20. The detachment interface is particularly smooth, especially in the case of a thermal interface. The detachment along this interface therefore induces a very low roughness of the detached surfaces 21, 11, 41, corresponding to the roughness of the interface before detachment. This makes it possible to limit the treatments to be applied to one or other of the detached surfaces 21, 11, 41 in order, respectively, to finish the composite structure 200 and to recycle the carrier substrate 10 for reuse.

Advantageously, the detachment process according to the present disclosure comprises, after step c), a step of heat treatment of the composite structure 200 at a temperature below 1000° C., in order to discharge the residual light species 30' still present in the transferred layers 20, 40 (FIGS. 4c and 5c).

In certain cases, the oxide layer 20 and potentially the thin barrier layer 45 are removed to give access to the underlying layer, for example, the useful layer 50' (FIG. 4c).

In one example of the second embodiment variant of the detachment process according to the present disclosure, the second substrate 50 provided in step a) comprises a carrier substrate 51 (hereinafter referred to as second carrier substrate 51), a trapping layer 52 positioned on the second carrier substrate 51 and a silicon oxide layer 53 (hereinafter referred to as second oxide layer 53) positioned on the trapping layer 52. During the attachment step a), the second oxide layer 53 is attached to the detachable substrate 100 at the bonding interface 3.

Figure 6:
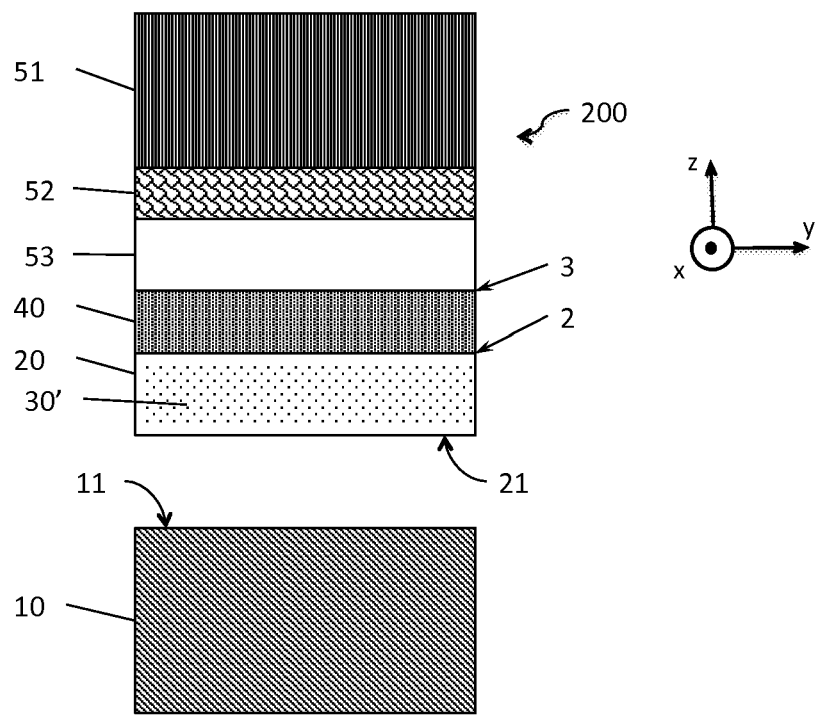
FIG. 6 shows an example of a composite structure obtained after detaching a detachable structure according to the second embodiment of the present disclosure.

As illustrated in FIG. 6, at the end of step c) of the detachment process, a composite structure 200 is obtained comprising a thin layer 40, suitable for the fabrication of components and positioned on a specific substrate comprising a trapping layer 52 and a second oxide layer 53, the latter forming the buried oxide of the composite structure 200.

Low-temperature finishing steps may then be applied such as, in particular, a heat treatment at a temperature less than or equal to 1000° C. in order to discharge the residue of light species 30' present in the thin layer 40 and in the oxide layer 20 (if it is present). Finally, a chemical treatment for removing the oxide layer 20 and a cleaning of the composite structure 200 may be applied in order to obtain an SOI-type substrate, with a high-quality thin layer 40 and a specific substrate suitable, in particular, for radiofrequency applications. The thin layer 40 may have a thickness of less than 100 nm, or less than 50 nm, or else less than 25 nm. Layers having such thicknesses and a high quality (in particular, uniformity better than ±1 nm, very low defectivity, low surface roughness <0.2 nm) are extremely complex to fabricate on a specific substrate comprising a trapping layer 52, especially owing to the temperature restriction of the finishing treatments, to avoid damaging the trapping layer 52.

The detachable structure 100 and the detachment process according to the present disclosure make it easy to obtain a composite structure 200 with a high-quality thin layer 40, irrespective of the thickness thereof.

In another example of the second embodiment variant of the detachment process, the second substrate 50 provided in step a) comprises a glass substrate.

At the end of step c) of the detachment process, a composite structure 200 is thus obtained comprising a thin layer 40, suitable for the fabrication of components and positioned on a specific glass substrate.

A thin layer having a high quality is extremely complex to fabricate on a specific substrate, of heterogeneous nature with respect to the thin layer 40, especially owing to the temperature restriction of the finishing treatments, to avoid damaging the thin layer and/or the heterostructure itself owing to the differential expansions of the materials forming the heterostructure. The detachable structure 100 and the detachment process according to the present disclosure make it easy to obtain a heterogeneous composite structure 200 with a high-quality thin layer 40 transferred to a glass substrate.

In yet another example of the second embodiment variant of the detachment process according to the present disclosure, the second substrate 50 provided in step a) comprises a second carrier substrate (made of silicon or other material of interest for the targeted application) and a second silicon oxide layer positioned on the second carrier substrate and having a thickness of greater than 800 nm, the second silicon oxide layer being intended to be attached to the detachable substrate at the bonding interface 3.

At the end of step c) of the detachment process, a composite structure 200 is thus obtained comprising a thin layer 40, suitable for the fabrication of components and positioned on a specific substrate provided with a thick second oxide layer.

A high-quality thin layer 40 is in general complex to fabricate on a specific substrate comprising a thick oxide layer. For example, obtaining thin layers of silicon (<100 nm) on thick oxides (>400 nm) is complex owing to the low elastic modulus of the oxide. Specifically, any mechanical stress (polishing, fracture) of the thin silicon layer risks leading to the rupture thereof owing to the deformation of the underlying thick oxide.

The detachable structure 100 and the detachment process according to the present disclosure make it easy to obtain a heterogeneous composite structure 200 with a high-quality thin layer 40 transferred to a thick oxide layer.

Of course, the invention is not limited to the embodiments described and embodiment variants may be introduced thereinto without departing from the scope of the invention such as defined by the claims.

The invention claimed is:

1. A detachable structure, comprising:
a carrier substrate; and
a silicon oxide layer positioned on the carrier substrate at a first interface;
wherein:
the oxide layer has a thickness of less than 200 nm;
light hydrogen and/or helium species are distributed deeply and over the entire area of the structure according to an implantation profile, a concentration maximum of which is located in the thickness of the oxide layer; and
a total dose of the implanted light hydrogen and/or helium species, relative to the thickness of the oxide layer, exceeds, at least by a factor of five, a solubility limit of the light hydrogen and/or helium species in the oxide layer.

2. The structure of claim 1, further comprising a thin layer suitable for the fabrication of components and/or forming a barrier layer, positioned on the oxide layer at a second interface.

3. The structure of claim 2, wherein the carrier substrate comprises silicon and the silicon oxide layer comprises a thermal oxide.

4. The structure of claim 3, in which wherein the thin layer is suitable for the manufacture of components and comprises monocrystalline silicon.

5. The structure of claim 3, wherein the thin layer is suitable for forming a barrier layer and comprises silicon nitride.

6. A method for detaching a detachable structure according to claim 2, the method comprising:
attaching the detachable structure to a second substrate along a bonding interface to form an assembly;
applying a heat treatment to the assembly to make at least some of the light species migrate level with the first interface or the second interface; and
spontaneously detaching the assembly at the first interface or the second interface, and forming a detached surface of the oxide layer so as to transfer at least the thin layer to the second substrate and form a composite structure.

7. The method of claim 6, wherein applying a heat treatment to the assembly comprises heating the assembly to a temperature between 200° C. and 600° C.

8. The method of claim 7, wherein the spontaneous detachment of the assembly occurs during the application of the heat treatment.

9. The method of claim 8, wherein the roughness of the detached surface of the oxide layer is less than 0.5 nm RMS.

10. The method of claim 9, wherein the detachable structure comprises a thin layer suitable for the fabrication of components positioned on the oxide layer at the second interface, in which the light hydrogen and/or helium species have been implanted in the thickness of the oxide layer after a step of finishing the thin layer.

11. The method of claim 10, wherein the step of finishing the thin layer comprises a high-temperature heat treatment above 1000° C.

12. The method of claim 10, wherein the second substrate comprises a second carrier substrate, a trapping layer positioned on the second carrier substrate and a second silicon oxide layer positioned on the trapping layer, the second oxide layer being attached to the detachable structure at the bonding interface.

13. The method of claim 10, wherein the second substrate comprises a glass substrate.

14. The method of claim 10, wherein the second substrate comprises a second carrier substrate and a second silicon oxide layer positioned on the second carrier substrate and having a thickness of greater than 800 nm, the second silicon oxide layer being intended to be attached to the detachable structure at the bonding interface.

15. The method of claim 10, further comprising, a step of heat treating the composite structure at a temperature below 1000° C. to discharge light species still present in the transferred thin layer.

16. The method of claim 6, wherein the spontaneous detachment of the assembly occurs during the application of the heat treatment.

17. The method of claim 6, wherein the roughness of the detached surface of the oxide layer is less than 0.5 nm RMS.

18. The method of claim 6, wherein the detachable structure comprises a thin layer suitable for the fabrication of components positioned on the oxide layer at the second interface, in which the light hydrogen and/or helium species have been implanted in the thickness of the oxide layer after a step of finishing the thin layer.

19. The method of claim 18, wherein the step of finishing the thin layer comprises a high-temperature heat treatment above 1000° C.

20. The method of claim 19, wherein the step of finishing the thin layer comprises a high-temperature heat treatment above 1100° C.

* * * * *

UNITED STATES PATENT AND TRADEMARK OFFICE
CERTIFICATE OF CORRECTION

PATENT NO. : 11,424,156 B2
APPLICATION NO. : 16/969346
DATED : August 23, 2022
INVENTOR(S) : Didier Landru et al.

Page 1 of 1

It is certified that error appears in the above-identified patent and that said Letters Patent is hereby corrected as shown below:

On the Title Page

In Item (73) change "Benin (FR)" to --Bernin (FR)--

In the Claims

Claim 4, Column 11, Line 30, change "in which wherein" to --wherein--

Signed and Sealed this
Twenty-fifth Day of April, 2023

Katherine Kelly Vidal
*Director of the United States Patent and Trademark Office*